United States Patent
Zandman et al.

(10) Patent No.: US 6,876,061 B2
(45) Date of Patent: Apr. 5, 2005

(54) CHIP SCALE SURFACE MOUNT PACKAGE FOR SEMICONDUCTOR DEVICE AND PROCESS OF FABRICATING THE SAME

(75) Inventors: Felix Zandman, Bala Cynwyd, PA (US); Y. Mohammed Kasem, Santa Clara, CA (US); Yueh-Se Ho, Sunnyvale, CA (US)

(73) Assignee: Vishay Intertechnology, Inc., Malvern, PA (US)

( * ) Notice: Subject to any disclaimer, the term of this patent is extended or adjusted under 35 U.S.C. 154(b) by 140 days.

(21) Appl. No.: 10/157,584

(22) Filed: May 28, 2002

(65) Prior Publication Data

US 2002/0185710 A1 Dec. 12, 2002

Related U.S. Application Data

(63) Continuation of application No. 09/395,097, filed on Sep. 13, 1999, now abandoned.

(51) Int. Cl.$^7$ .......................... H01L 29/06; H01L 23/04; H01L 23/48; H01L 23/52
(52) U.S. Cl. .................... 257/620; 257/622; 257/625; 257/723; 257/730; 257/692; 257/698; 257/690
(58) Field of Search .................... 257/730, 692, 257/698, 690, 620, 622, 625, 723

(56) References Cited

U.S. PATENT DOCUMENTS

| | | | |
|---|---|---|---|
| 4,249,299 A | 2/1981 | Stephens et al. | 29/578 |
| 5,270,261 A | 12/1993 | Bertin et al. | 437/209 |
| 5,324,981 A | 6/1994 | Koboki et al. | 257/276 |
| 5,338,967 A | 8/1994 | Kosaki | 257/706 |
| 5,753,529 A | 5/1998 | Chang et al. | 437/67 |
| 5,757,081 A | 5/1998 | Chang et al. | 257/778 |
| 5,767,578 A | 6/1998 | Chang et al. | 257/717 |
| 5,872,396 A | 2/1999 | Kosaki | 257/712 |
| 5,888,884 A | 3/1999 | Wojnarowski | 438/462 |
| 5,910,687 A | 6/1999 | Chen et al. | 257/784 |
| 6,054,760 A * | 4/2000 | Martinez-Tovar et al. | 257/692 |

FOREIGN PATENT DOCUMENTS

| | | | |
|---|---|---|---|
| JP | 07/169796 | 7/1995 | ........... H01L/21/60 |
| WO | WO 98/19337 | 5/1998 | ........... H01L/21/44 |

OTHER PUBLICATIONS

Lawrence Kren, "The Race For Less Space", Machine Design, Jul. 8, 1999, pp. 86–89.
Patrick Mannion, "MOSFETs Break Out Of The Shackles Of Wirebonding", Electronic Design, Mar. 22, 1999, vol. 47, No. 6, pp. 1–5.

* cited by examiner

*Primary Examiner*—Eddie Lee
*Assistant Examiner*—Nitin Parekh

(57) ABSTRACT

A semiconductor package by which contacts are made to both sides of the dice is manufactured on a wafer scale. The back side of the wafer is attached to a metal plate. The scribe lines separating the dice are saw cut to expose the metal plate but the cuts do not extend through the metal plate. A metal layer, which may include a number of sublayers, is formed on the front side of the dice, the metal covering the exposed portions of the metal plate and extending the side edges of the dice. Separate sections of the metal layer may also cover connection pads on the front side of the dice. A second set of saw cuts are made coincident with the first set of saw cuts, using a blade that is narrower than the blade used to make the first set of saw cuts. As a result, the metal layer remains on the side edges of the dice connecting the back and front sides of the dice (via the metal plate). Since no wire bonds are required, the resulting package is rugged and provides a low-resistance electrical connection between the back and front sides of the dice.

22 Claims, 13 Drawing Sheets

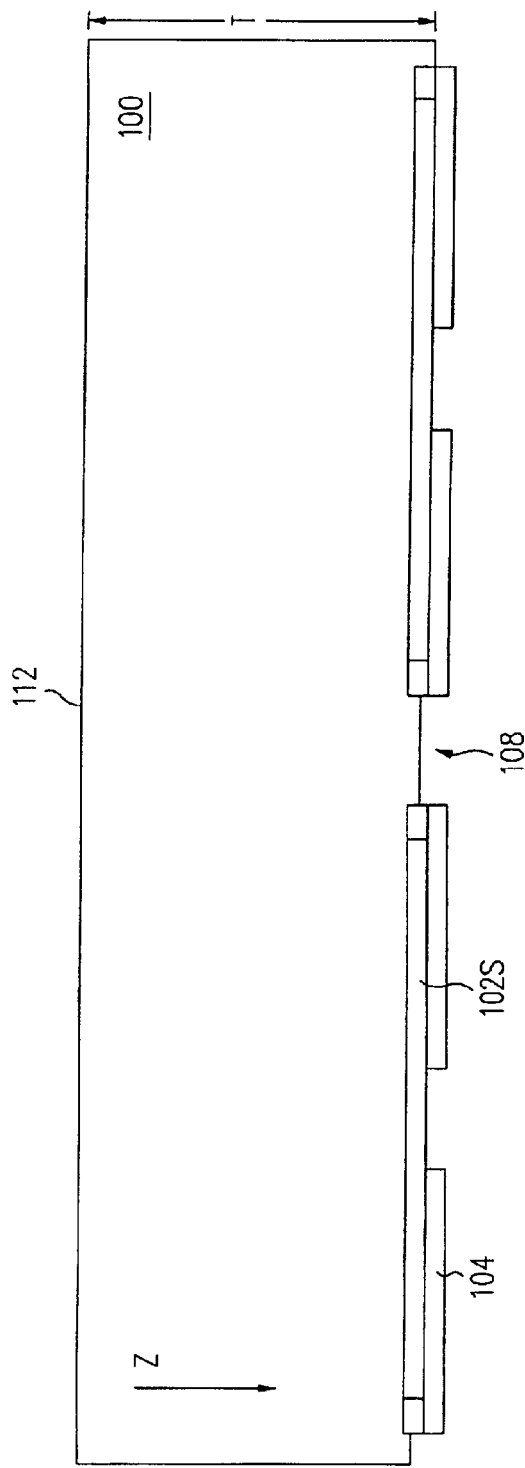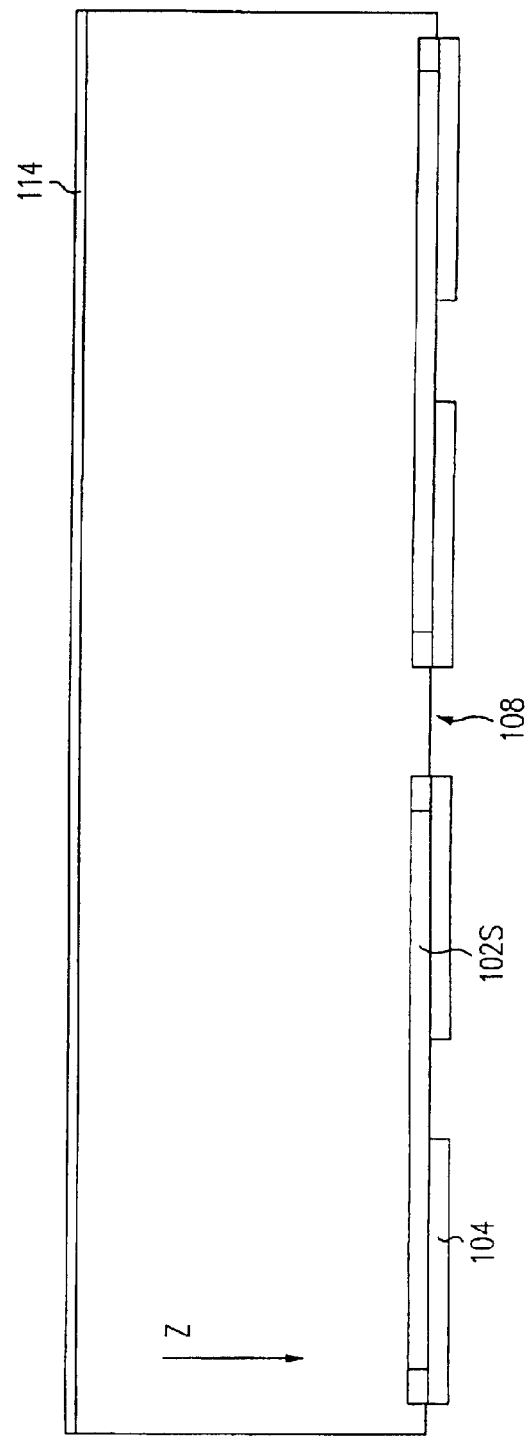

CHIP SCALE SURFACE MOUNT PACKAGE FOR SEMICONDUCTOR DEVICE AND PROCESS OF FABRICATING THE SAME

CROSS REFERENCE TO RELATED APPLICATION

This application is a continuation of U.S. patent application Ser. No. 09/395,097, filed Sep. 13, 1999 now abandoned, entitled "Chip Scale Surface Mount Package For Semiconductor Device And Process Of Fabricating The Same." This application is related to application Ser. No. 09/395,095, now U.S. Pat. No. 6,271,060, and application Ser. No. 09/395,094, now U.S. Pat. No. 6,316,287, both of which were filed by the same applicants, and were under obligation to be assigned to the Assignee of this application, on the same date as this application and both of which are incorporated herein by reference.

BACKGROUND OF THE INVENTION

After the processing of a semiconductor wafer has been completed, the resulting integrated circuit (IC) chips or dice must be separated and packaged in such a way that they can be connected to external circuitry. There are many known packaging techniques. Most involve mounting the die on a leadframe, connecting the die pads to the leadframe by wire-bonding or otherwise, and then encapsulating the die and wire bonds in a plastic capsule, with the leadframe left protruding from the capsule. The encapsulation is often done by injection-molding. The leadframe is then trimmed to remove the tie bars that hold it together, and the leads are bent in such a way that the package can be mounted on a flat surface, typically a printed circuit board (PCB).

This is generally an expensive, time-consuming process, and the resulting semiconductor package is considerably larger than the die itself, using up an undue amount of scarce "real estate" on the PCB. In addition, wire bonds are fragile and introduce a considerable resistance between the die pads and the leads of the package.

The problems are particularly difficult when the device to be packaged is a "vertical" device, having terminals on opposite faces of the die. For example, a power MOSFET typically has its source and gate terminals on the front side of the die and its drain terminal on the back side of the die. Similarly, a vertical diode has its anode terminal on one face of the die and its cathode terminal on the opposite face of the die. Bipolar transistors, junction field effect transistors (JFETs), and various types of integrated circuits (ICs) can also be fabricated in a "vertical" configuration.

Accordingly, there is a need for a process which is simpler and less expensive than existing processes and which produces a package that is essentially the same size as the die. There is a particular need for such a process and package that can be used with semiconductor dice having terminals on both their front and back sides.

SUMMARY OF THE INVENTION

The process of fabricating a semiconductor device package in accordance with this invention begins with a semiconductor wafer having a front side and a back side and comprising a plurality of dice separated by scribe lines. Each die comprises a semiconductor device. A surface of the front side of each die comprises a passivation layer and at least one connection pad in electrical contact with a terminal of the semiconductor device. The back side of each die may also be in electrical contact with a terminal of the semiconductor device.

The process comprises the following steps: attaching a conductive substrate to a back side of the wafer; cutting through the wafer along a scribe line to form a first cut, the first cut exposing the conductive substrate and a side edge of a die, a kerf of the first cut having a first width W1; forming a metal layer which extends from the portion of the conductive substrate exposed by the first cut, along the side edge of the die, and onto at least a portion of the passivation layer; cutting through the conductive substrate along a line that corresponds to the scribe line to form a second cut, a kerf of the second cut having a second width W2 that is smaller than the first width W1 such that at least a portion of the metal layer remains on the side edge of the die and forms a part of a conductive path between the conductive substrate and a location on the front side of the die.

The process may also include forming at least one additional metal layer in electrical contact with the at least one connection pad. Forming the metal layer may include depositing several sublayers.

Forming the metal layer may comprise, for example, depositing a metal sublayer on the front side of the die, the side edge of the dice and the exposed portion of the conductive substrate; depositing a mask layer; patterning the mask layer; removing a portion of the mask layer so as to form an opening that exposes a first portion of the metal sublayer, a remaining portion of the mask layer covering a second portion of the metal sublayer, the second portion of the metal sublayer being in contact with the conductive substrate and the side edge of the die; removing the first portion of the metal sublayer; and removing the remaining portion of the mask layer.

This invention also includes a process for making an electrical connection between a first side of a semiconductor die and a location on a second side of the semiconductor die, the process commencing while the die is a part of a semiconductor wafer. The process comprises attaching a conductive substrate to the first side of the wafer; cutting through the semiconductor wafer from the second side of the wafer to expose a part of the conductive substrate; forming a metal layer extending laterally from the location on the second side of the die along an edge of the die to the exposed part of the conductive substrate; and cutting through the conductive substrate while leaving intact a region of contact between the metal layer and the conductive substrate.

According to another aspect, this invention includes a package for a semiconductor device comprising: a die containing a semiconductor device, a front side of the die comprising a passivation layer and a connection pad, the connection pad being in electrical contact with the semiconductor device; a conductive plate attached to a back side of the die, the conductive plate extending beyond a side edge of the die to form a protruding portion of the conductive plate; and a metal layer extending from the protruding portion of the conductive plate, along the side edge of the die and onto the passivation layer, the metal layer being electrically insulated from the connection pad.

According to yet another aspect, this invention also includes a semiconductor structure comprising a conductive substrate; a plurality of semiconductor dice attached to the substrate, rows of the dice being separated from each other by a plurality of parallel trenches, a passivation layer on a front side of each die; and a metal layer lining the bottoms and walls of the trenches and extending onto the passivation layer Semiconductor packages according to this invention do not require an epoxy capsule or bond wires; the substrate attached to the die serves to protect the die and act as a heat sink for the die; the packages are very small (e.g., 50% the size of molded packages) and thin; they provide a very low on-resistance for the semiconductor device, particularly if the wafer is ground thinner; they are economical to produce, since they require no molds or lead frames; and they can be used for a wide variety of semiconductor devices such as diodes, MOSFETs, JFETs, bipolar transistors and various types of integrated circuit chips.

BRIEF DESCRIPTION OF THE DRAWINGS

This invention will be better understood by reference to the following drawings (not drawn to scale), in which similar components are similarly numbered.

FIGS. 2A–2B, 3, 4, 5, and 6A–6B through 12A–12B illustrate the steps of a process of fabricating a semiconductor package in accordance with this invention.

DESCRIPTION OF THE INVENTION

Figure 1:
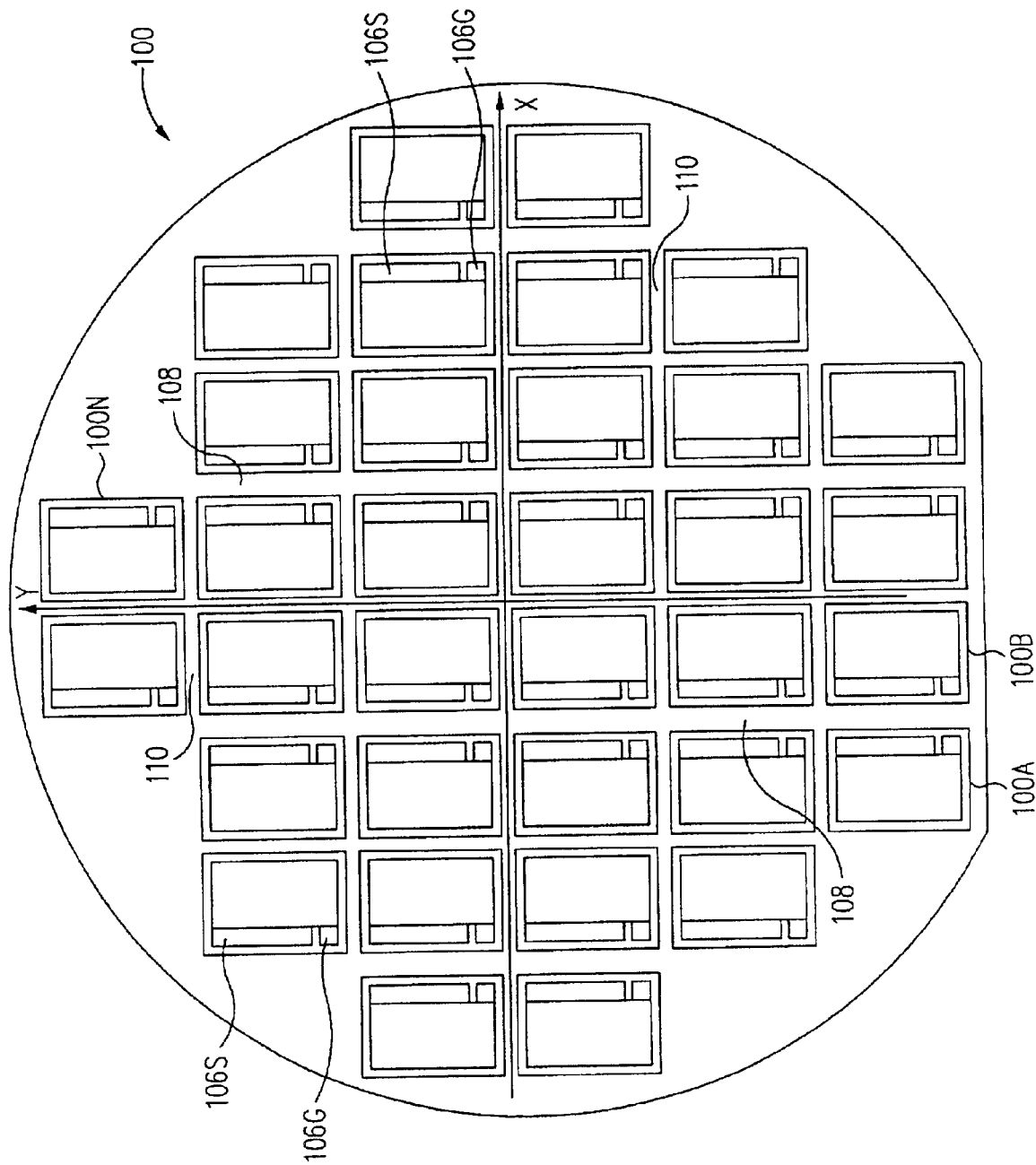
FIG. 1 illustrates a top view of a semiconductor wafer.

FIG. 1 shows a top view of a semiconductor wafer 100 which contains dice 100A, 100B through 100N. The individual dice are separated by a perpendicular network of scribe lines, with scribe lines 108 running in the Y direction and scribe lines 110 running in the X direction. Metal pads for connecting to external circuit elements are located on the top surface of each of the dice 100A–100N. For example, since dice 100A–100N contain vertical power MOSFETs, each die has a source connection pad 106S and a gate connection pad 106G.

Wafer 100 typically has a thickness in the range of 15–30 mils. Wafer 100 is typically silicon but it could also be another semiconductor material such as silicon carbide or gallium arsenide.

As described above, before dice 100A–100N can be used they must be packaged in a form that allows them to be connected to external circuitry.

The process of this invention is illustrated in FIGS. 2A–2B, 3, 4, 5, and 6A–6B through 12A–12B, which show two dice 100A and 100B that are part of a semiconductor wafer 100. While only two dice are shown for purposes of explanation, it will be understood that wafer 100 would typically include hundreds or thousands of dice.

In each drawing where applicable, the figure labeled "A" is a top or bottom view of the wafer; the figure labeled "B" is an enlarged cross-sectional view taken at the section labeled "B—B" in the "A" figure. As described below, in the course of the process the wafer is attached to a conductive plate, the back side of the wafer facing the conductive plate. In the finished package the wafer is normally positioned under the conductive plate, although at some points in the process the structure may be inverted, with the conductive plate under the wafer. Unless the context clearly indicates otherwise, as used herein "above", "below", "over", "under" and other similar terms refer to the package in its finished form with the conductive plate above the wafer.

This invention will be described with respect to a package for a vertical power MOSFET, which typically has source and gate terminals on its front side and a drain terminal on its back side. It should be understood, however, that the broad principles of this invention can be used to fabricate a package for any type of semiconductor die which has one or more terminals on both its front and back sides or on its front side alone. As used herein, the "front side" of a die or wafer refers to the side of the die or wafer on which the electrical devices and/or a majority of the connection pads are located; "back side" refers to the opposite side of the die or wafer. The directional arrow labeled "Z" points to the front side of the wafer and identifies the drawings in which the wafer is inverted.

Figure 2A:
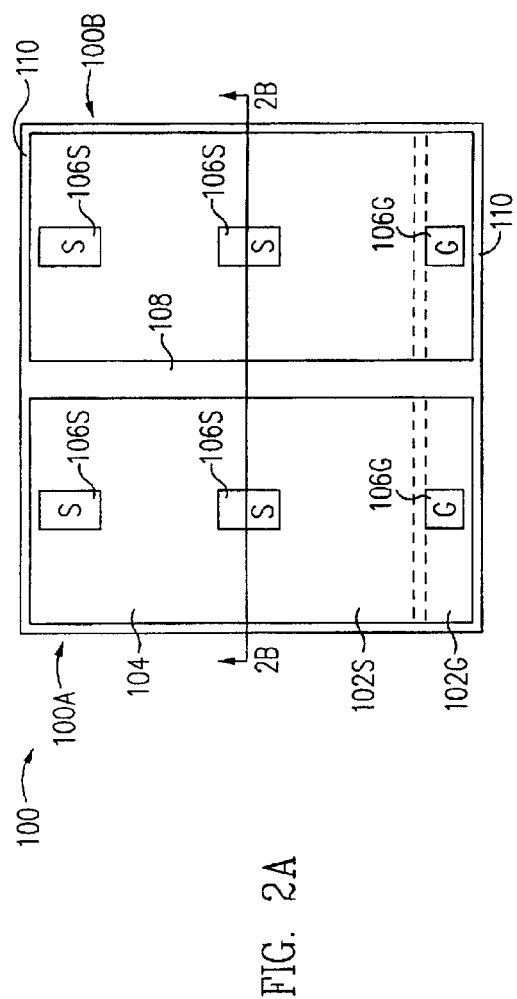
Figure 2B:
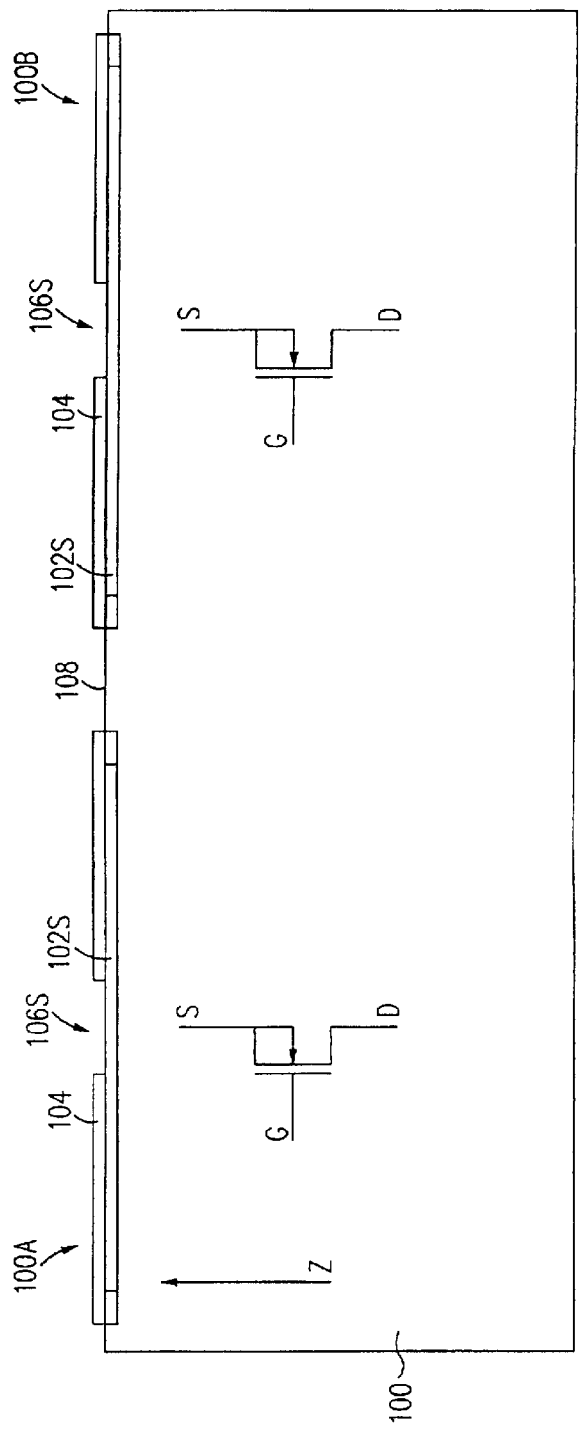

Referring to FIGS. 2A–2B, since dice 100A and 100B contain power MOSFETs (shown symbolically), each die has a gate metal layer 102G and a source metal layer 102S overlying the top surface of the silicon or other semiconductor material. Gate metal layer 102G and source metal layer 102S are in electrical contact with the gate and source terminals (not shown), respectively, of the power MOSFETs within dice 100A and 100B. In FIG. 2A, the separation between layers 102G and 102S is shown by the dashed lines.

Typically, metal layers 102G and 102S include aluminum, although copper layers are also being used. In most embodiments of this invention, metal layers 102G and 102S need to be modified so that they will adhere to a solder metal such as tin/lead, for the reasons described below. If there is a native oxide layer on the metal, this native oxide layer must first be removed. Then a solderable metal, such as gold, nickel or silver, is deposited on the exposed metal. The removal of the oxide layer and deposition of a solderable metal can be accomplished by means of a number of known processes. For example, an aluminum layer can be sputter-etched to remove the native aluminum oxide layer and then gold, silver or nickel can be sputtered onto the aluminum. Alternatively, the die can be dipped in a liquid etchant to strip away the oxide layer and the solderable metal can then be deposited by electroless or electrolytic plating. Electroless plating includes the use of a "zincating" process to displace the oxide, followed by the plating of nickel to displace the zincate.

In one embodiment metal layers 102G and 102S include a 3 μm sublayer of Al overlain by a 1,000 Å TiN sublayer and a 500 Å Ti sublayer.

A passivation layer 104 overlies a portion of gate metal layer 102G and source metal layer 102S. Passivation layer 104 can be formed of phosphosilicate glass (PSG) 1 μm thick, for example, or polyimide or nitride. Openings in passivation layer 104 define a gate connection pad 106G and source connection pads 106S.

Dice 100A and 100B are separated by a Y-scribe line 108, which can be 6 mils wide. X-scribe lines 110 perpendicular to scribe line 108 at the top and bottom of dice 100A and 100B can be 4 mils wide.

Wafer 100 can initially be ground from its backside 112 to a thickness T (about 8 mils, for example), as shown in FIG. 3. The grinding may be performed using a grinding machine available from Strausbaugh. During the grinding the front side of wafer 100 is typically taped. Grinding reduces the resistance to current flow from the front side to the back side of the wafer.

As an alternative to grinding, wafer 100 can be thinned by lapping or etching the back side of the wafer.

As shown in FIG. 4, a metal layer 114 is then formed on the backside 112 of wafer 100. For example, metal layer 114 can include a 500 Å titanium sublayer overlain by a 3,000 Å nickel sublayer and a 1 μm silver sublayer. The titanium, nickel and silver sublayers can be deposited by evaporation or sputtering. Metal layer 114 is used to provide good adhesion to the silver-filled epoxy, described below.

Figure 5:
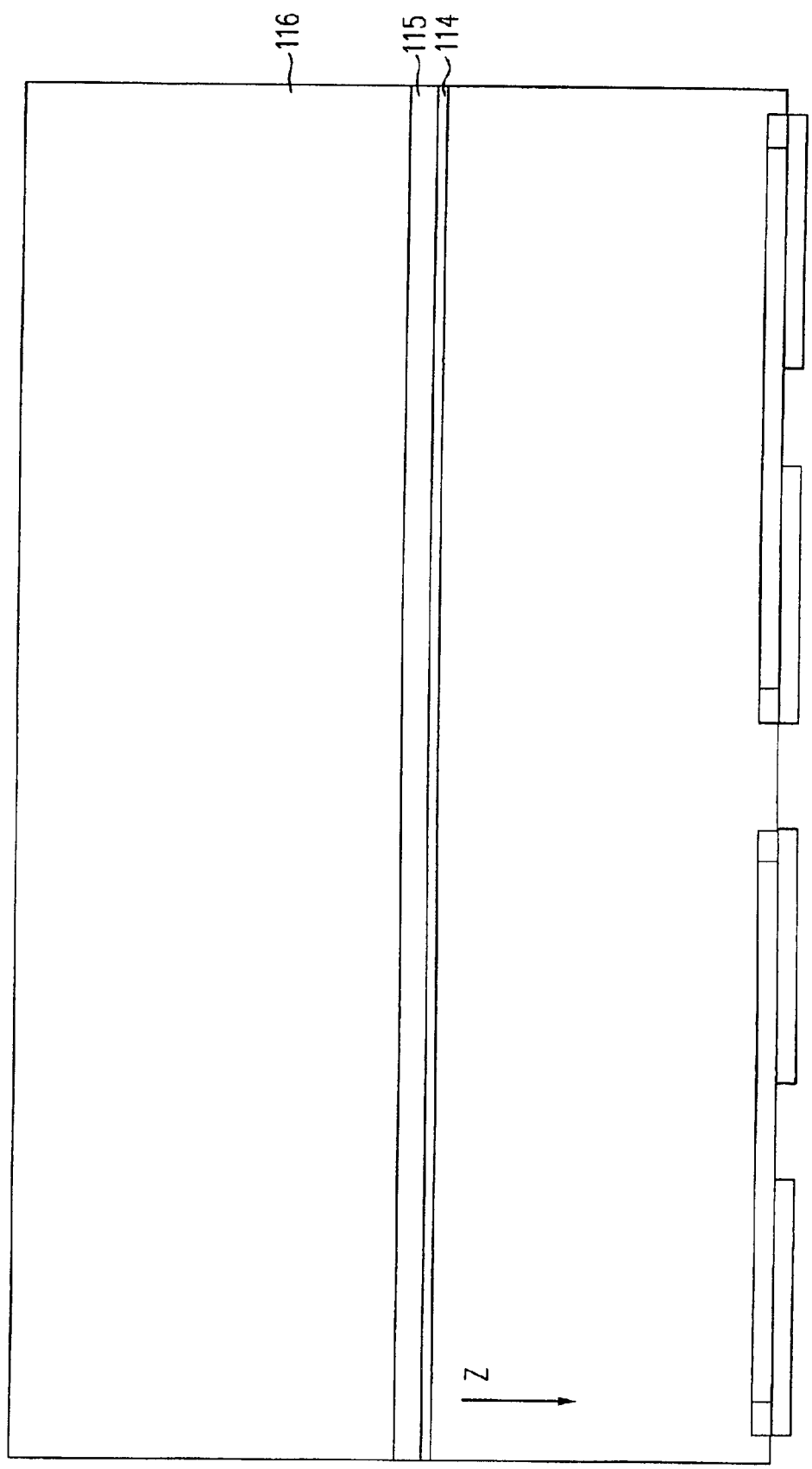

Next, as shown in FIG. 5, a metal plate 116 is attached to metal layer 114 and the backside of the wafer 100, using a layer 115 of a conductive cement such as conductive silver-filled epoxy or metallic cement. Metal plate 116 can be copper or aluminum and can be 6 mils thick, for example.

Figure 6A:
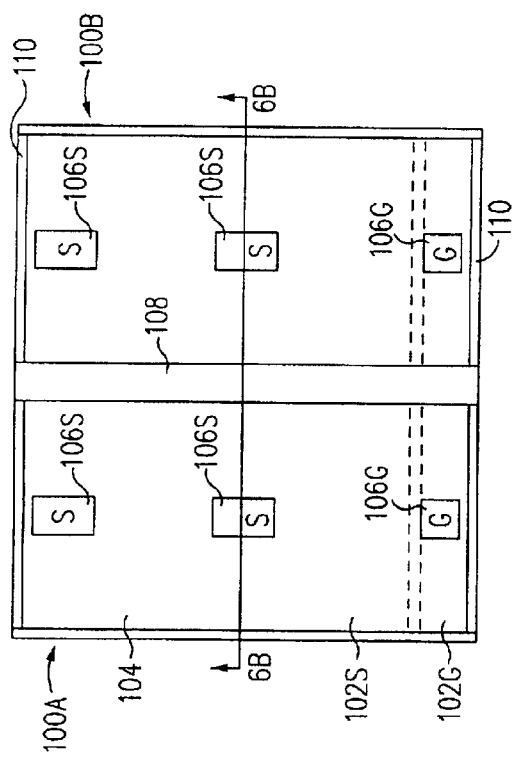
Figure 6B:
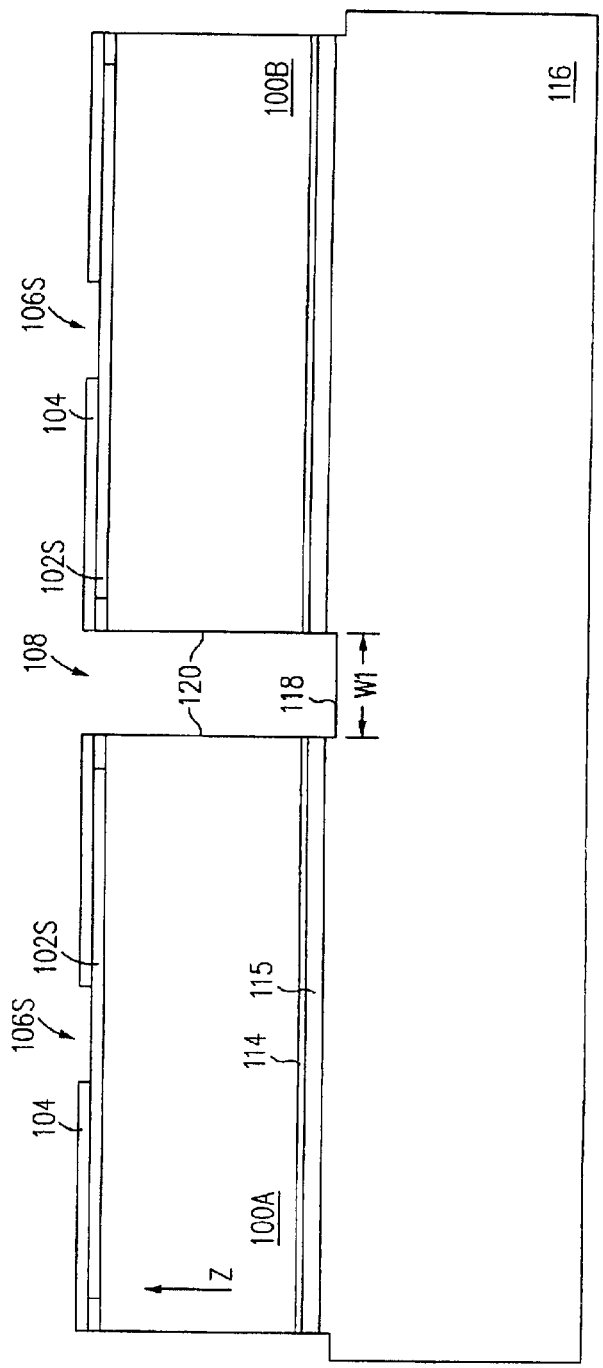

As shown in FIGS. 6A–6B, wafer 100 is cut, using a conventional dicing saw, along the Y-scribe line 108. In this case the kerf W1 of the cut is the same as the width of the scribe line (6 mils). The cut is made just deep enough to expose a surface 118 of the metal plate 116 as well as side edges 120 of the dice 100A and 100B. In this embodiment, no cut is made along X-scribe lines 110 at this point in the process.

Figure 7A:
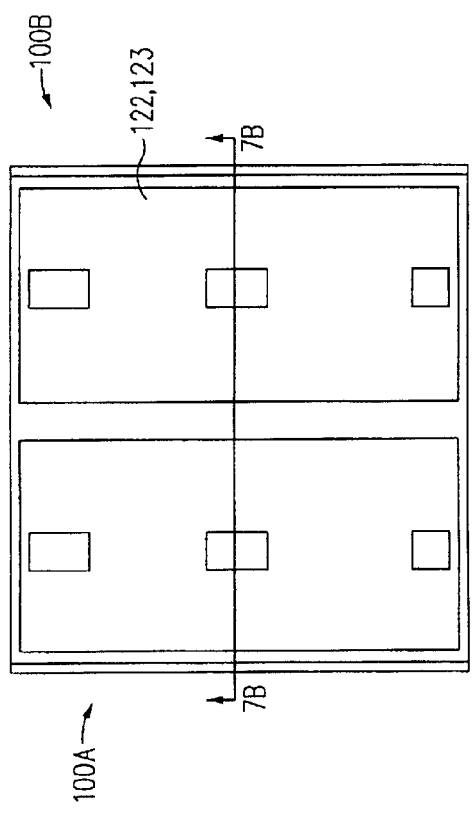
Figure 7B:
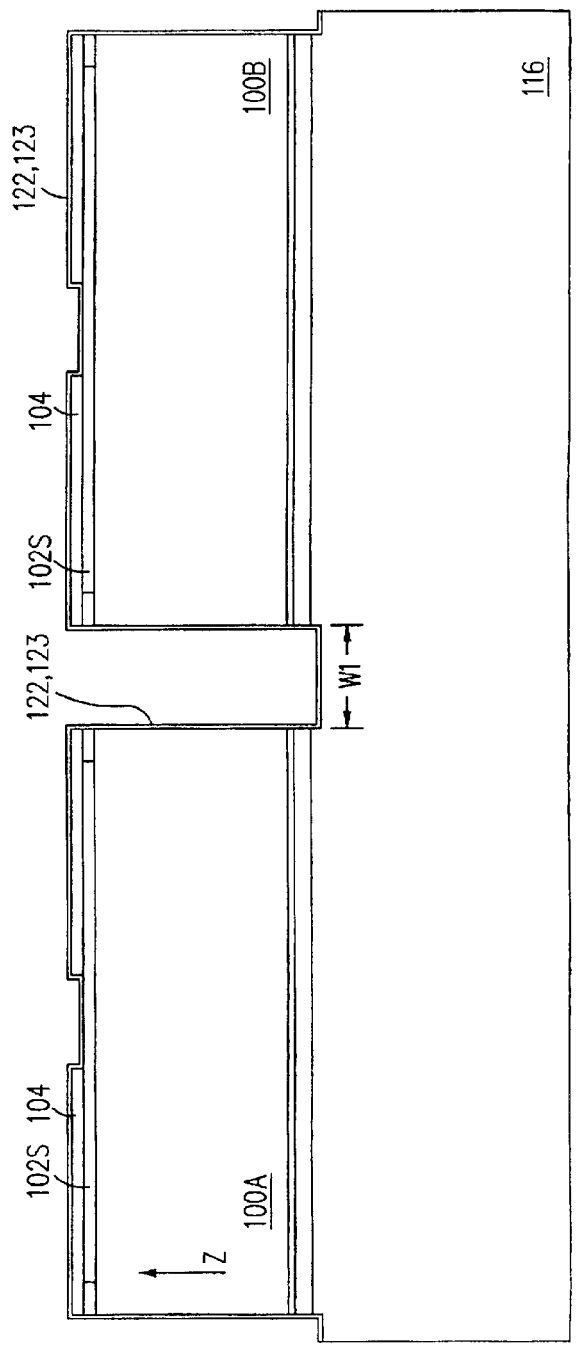

A 500 Å titanium sublayer 122 is then sputtered on the front side of wafer 100, covering the passivation layer 104, the connection pads 106G and 106S, the exposed surface 118 of metal layer 116, and the side edges 120 of dice 100A and 100B. A 1 μm aluminum sublayer 123 is then sputtered on top of titanium sublayer 122. Sublayers 122 and 123 are shown in FIGS. 7A–7B.

Figure 8A:
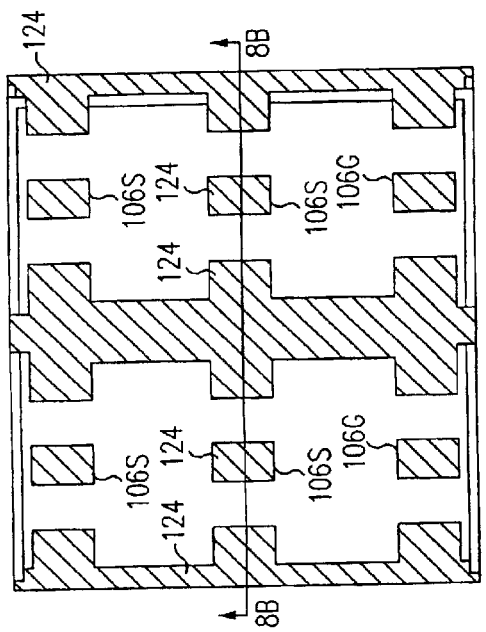
Figure 8B:
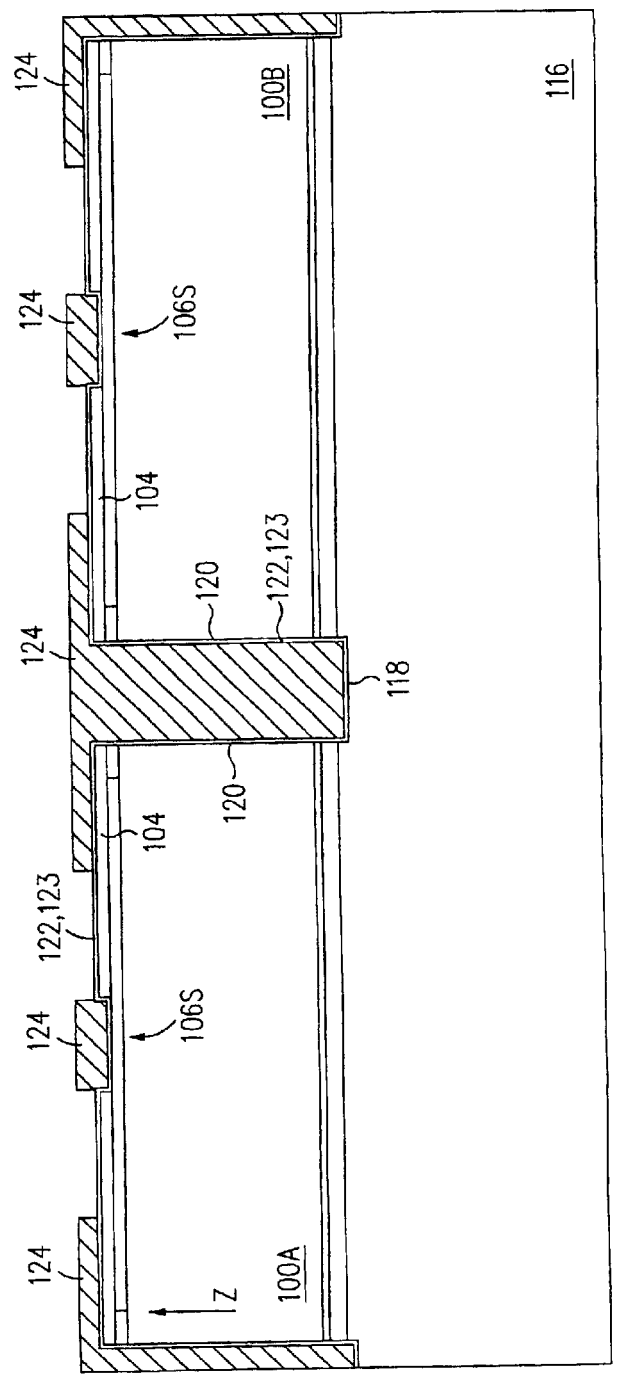

Next a photoresist mask layer 124 is deposited over sublayers 122 and 123. Photoresist mask layer 124 is patterned, using conventional photolithographic methods, and a portion of layer 124 is removed, yielding the pattern shown in FIGS. 8A–8B. As shown, the portions of photoresist layer 124 that remain cover the connection pads 106G and 106S, the surface 118 of metal plate 116, the side edges 120 of dice 100A and 100B, and a portion of passivation layer 104 adjacent the side edges 120 of dice 100A and 100B. Photoresist layer 124 is also left in place over a portion of passivation layer 104.

Figure 9A:
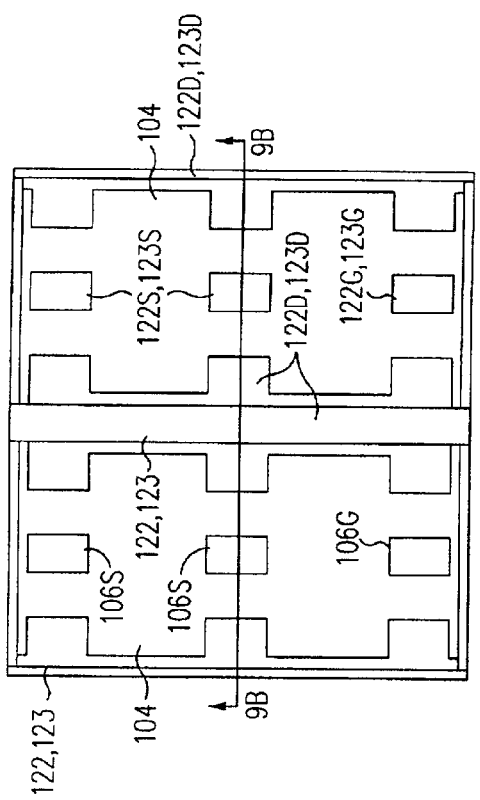
Figure 9B:
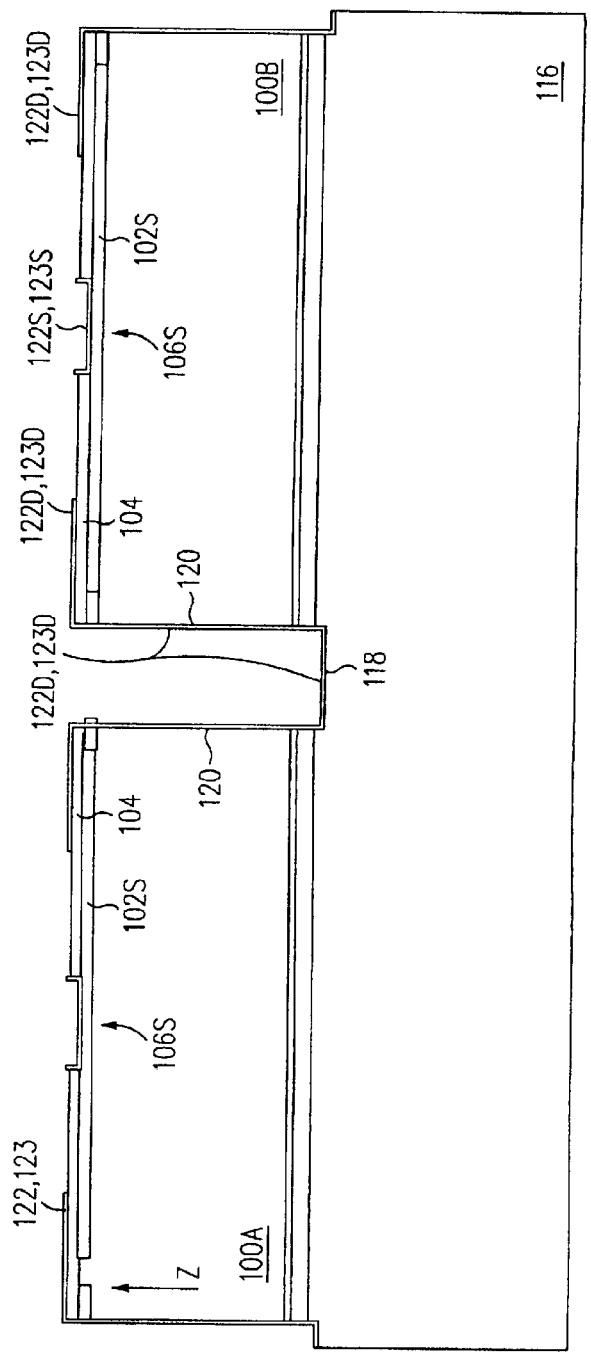

Sublayers 122 and 123 are then etched through the openings in photoresist layer 124, using a wet chemical etchant. The remaining portions of photoresist layer 124 are stripped. In the resulting structure, shown in FIGS. 9A–9B, portions of sublayers 122 and 123 remain on the connection pads 106G and 106S. These portions are designated 122G, 123G and 122S, 123S, respectively. Another portion of sublayers 122 and 123, designated 122D, 123D, extends from the exposed surface 118 of metal plate 116, up the side edges 120 of dice 100A and 100B, and onto a portion of passivation layer 104. Portions 122G, 123G and 122S, 123S and 122D, 123D of metal layers 122, 123 are electrically insulated from each other.

Figure 10A:
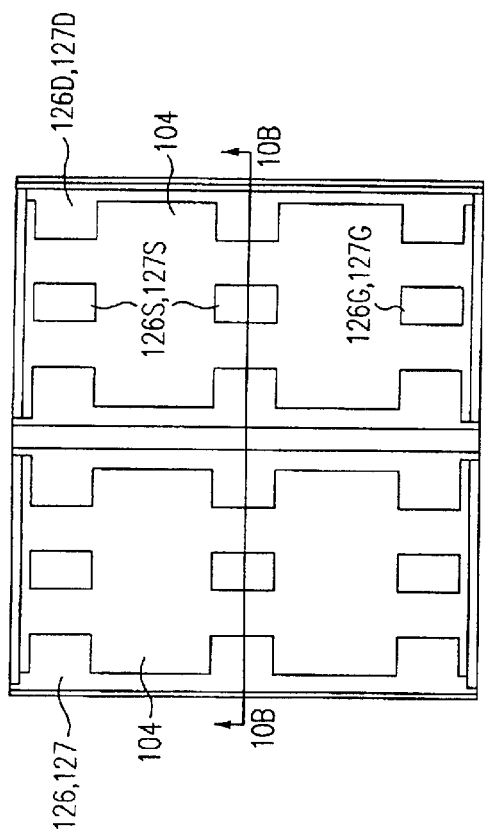
Figure 10B:
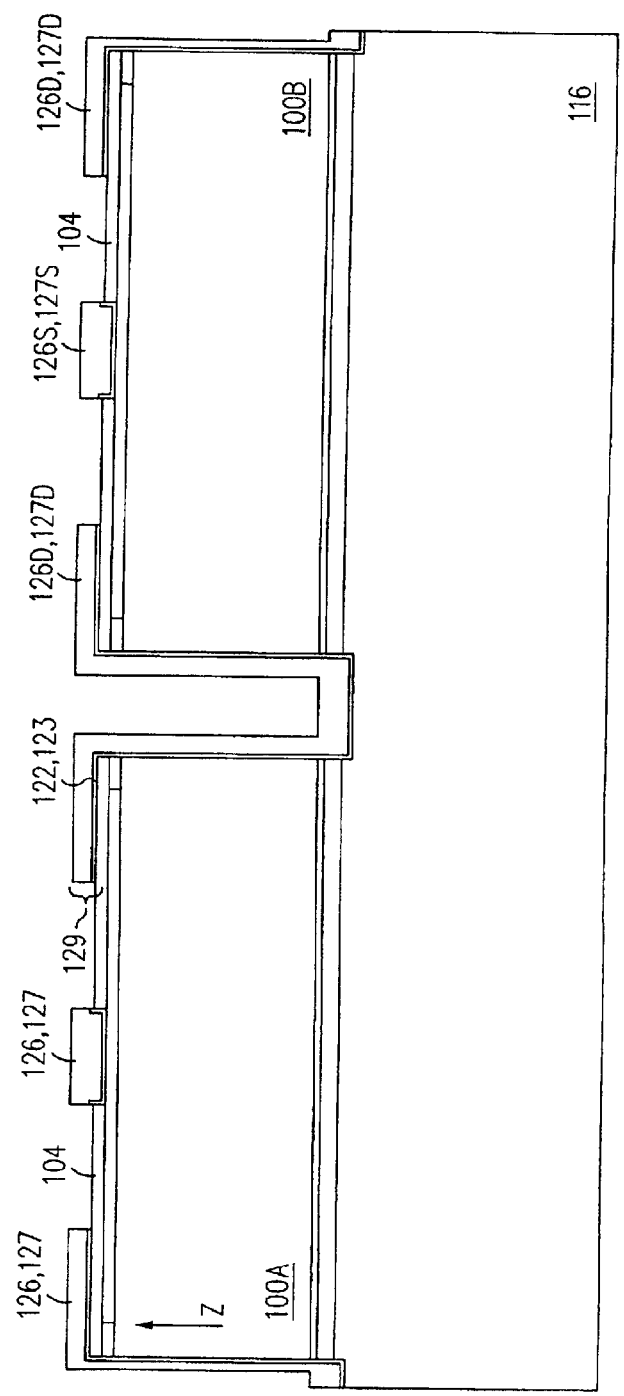

A nickel sublayer 126, for example 10 μm thick, is then deposited on the remaining portions of sputtered aluminum sublayer 123, preferably by electroless plating. A gold sublayer 127, which can be 0.1 μm thick, is then electrolessly plated onto nickel sublayer 126. The resulting structure is illustrated in FIGS. 10A–10B. Sublayers 126, 127 are divided into portions 126S, 127S which overlie portions 122S, 123S and are in electrical contact with the source pads 106S; portions 126G, 127G which overlie portions 122G, 123G and are in electrical contact with the gate pads 106G; and portions 126D, 127D which overlie portions 122D, 123D and are in electrical contact with the drain terminal of the device. Portions 126S, 127S and 126G, 127G and 126D, 127D are electrically insulated from each other. As an alternative, sublayer 126 may also be copper deposited by electroplating.

As shown in FIGS. 10A–10B, sublayers 122, 123, 126 and 127 together form a metal layer 129. As will be apparent to those skilled in the art, in other embodiments metal layer 129 can contain fewer or more than four sublayers. Moreover, metal layer 129 can contain fewer or more than two sputtered layers and fewer or more than two plated layers. The sublayers may also be deposited by other processes such as evaporation, electroless or electrolytic plating, stencil-printing or screen-printing. Sublayers 122, 123, 126 and 127 are sometimes referred to herein collectively as metal layer 129.

At this stage of the process there exists semiconductor structure comprising a conductive substrate, represented by metal plate 116; a plurality of semiconductor dice 100A–100N attached to the substrate. Rows of the dice are separated from each other by parallel trenches, the trenches being represented by the cuts extending through the wafer 100, a front side of each die comprising a passivation layer 104; and a metal layer 129 lining the bottoms and walls of the trenches and extending onto the passivation layers.

Figure 11A:
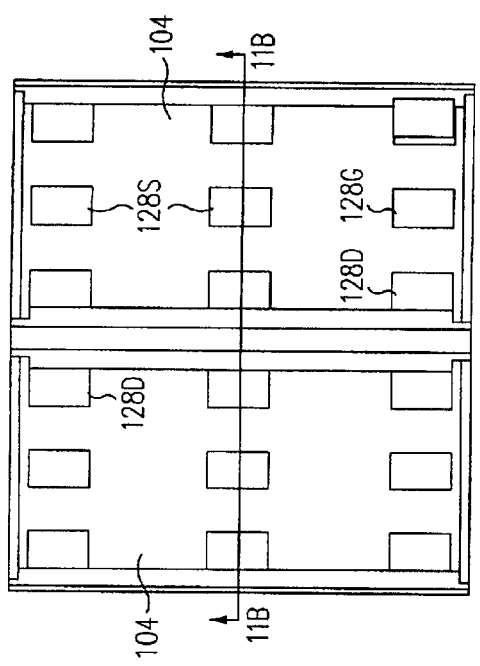
Figure 11B:
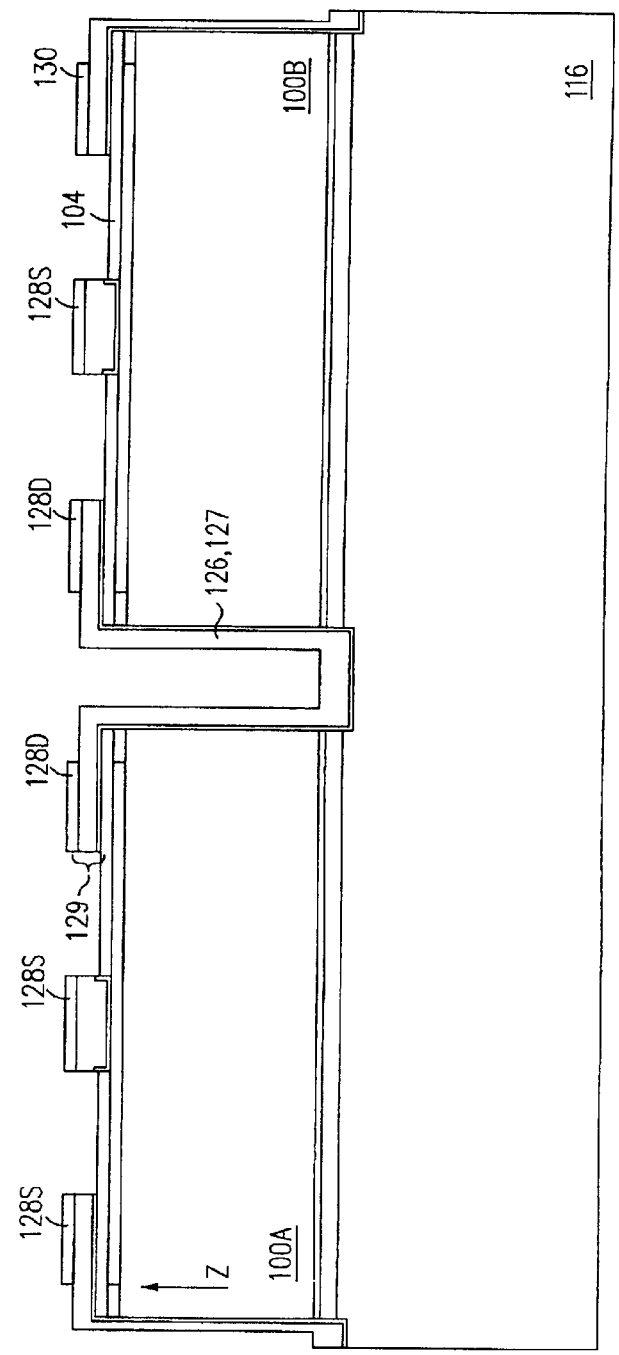

Optionally, a layer 130 of solder paste is then stencil or screen printed on at least a portion of the horizontal surfaces of metal layer 129. The solder paste is reflowed to produce the gate solder posts 128G, the source solder posts 128S and the drain solder posts 128D shown in FIGS. 11A–11B. Solder posts 128G, 128S and 128D are electrically insulated from each other.

Figure 12A:
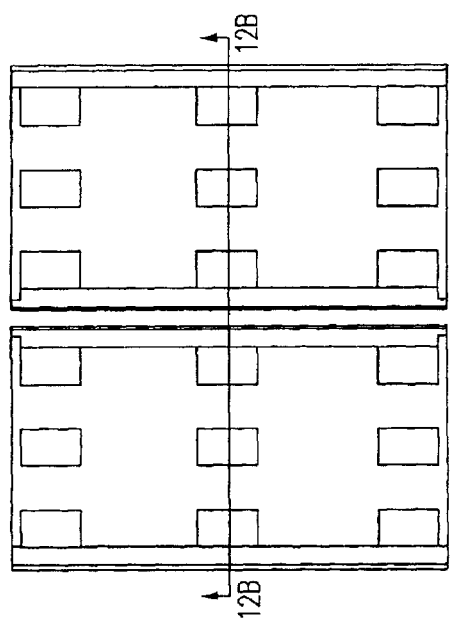
Figure 12B:
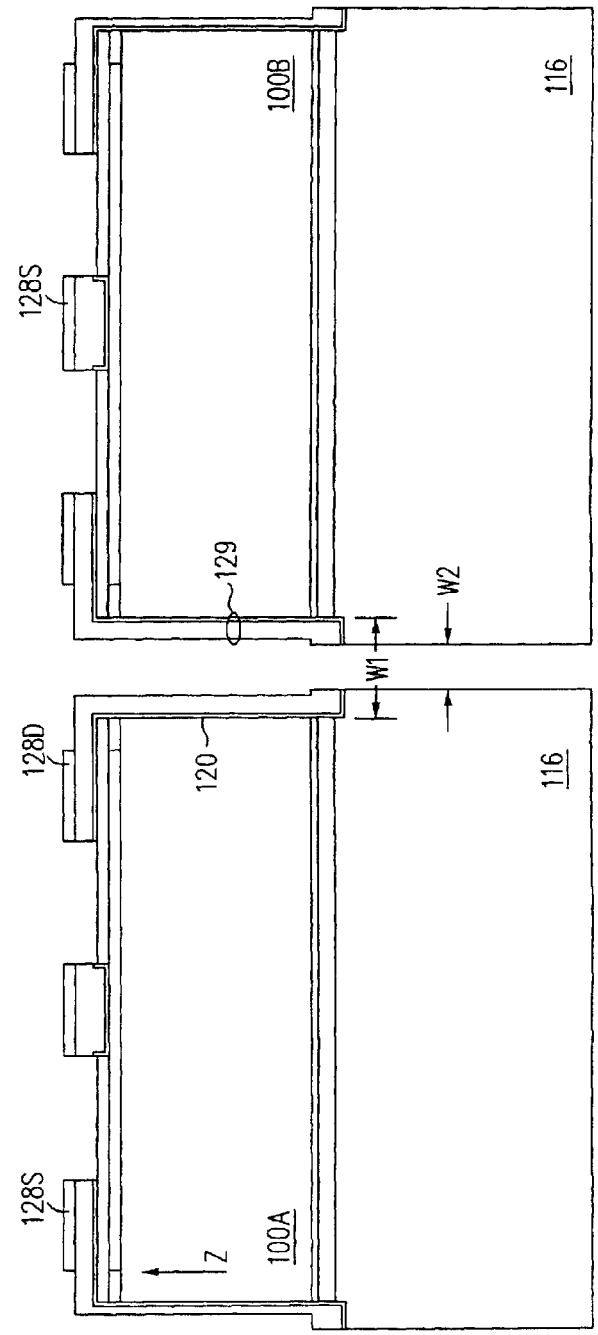

As shown in FIGS. 12A–12B, dice 100A and 100B are detached by sawing through metal plate 116 in the Y-direction. The saw blade is selected such that the kerf W2 of the cut is less than kerf W1 of the cut that was previously made to separate dice 100A and 100B. Since W1 was 6 mils, W2 could be 2 mils, for example. As a result the portion of metal layer 129 that extends up the side edges 120 of dice 100A and 100B remains in place and forms a part of an electrical connection between metal plate 116 and the drain solder posts 128D.

Dice 100A and 100B are then separated from the neighboring dice in the Y direction by cutting wafer 100 and metal plate 116 along the X-scribe lines 110, using a dicing saw. Alternatively, dice 100A and 100B can be separated from the neighboring dice in the Y direction by photolithographic patterning and etching.

Figure 13A:
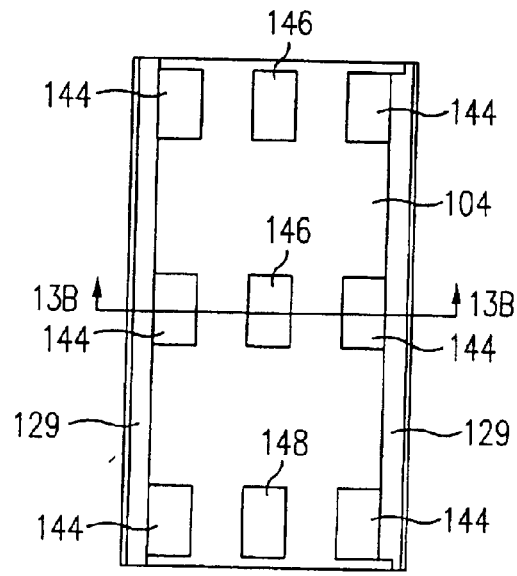
FIG. 13A illustrates a bottom view of a semiconductor package in accordance with this invention.
Figure 13B:
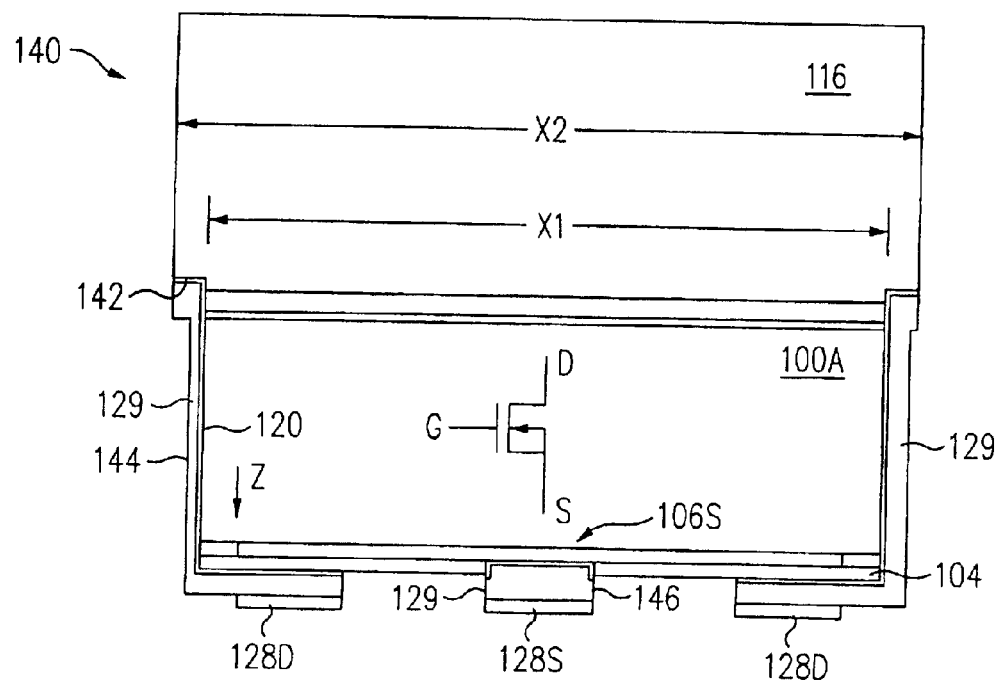
FIG. 13B illustrates a cross-sectional view of the semiconductor package.

A bottom view of the resulting semiconductor device package 140 is shown in FIG. 13A, and a cross-sectional view of package 140 is shown in FIG. 13B. Package 140 comprises die 100A, which has been inverted as compared with FIG. 12B. A front side of die 100A comprises connection pad 106S in electrical contact with the semiconductor device (e.g., a MOSFET) within die 100A and passivation layer 104. Package 140 also includes conductive plate 116, a back side of die 100A being attached to conductive plate 116. Conductive plate 116 has a width X2 greater than a width X1 of die 100A such that conductive plate 116 extends beyond a side edge 120 of the die 100A to form an protruding portion 142 of conductive plate 116. A flange portion of metal layer 144 is in contact with the protruding portion 142 of the conductive plate 116, and metal layer 144 extends from the protruding portion 142, along the side edge 120 of the die 100A and onto the passivation layer 104. The metal layer 144 is in electrical contact with the drain terminal of the MOSFET but is electrically insulated from source connection pads 102S and gate connection pads 102G. A second metal layer 146 is in electrical contact with source connection pads 102S but electrically insulated from gate connection pads 102G and the drain terminal of the MOSFET and a third metal layer 148 is in electrical contact with gate connection pads 102G but electrically insulated from source connection pads 102S and the drain terminal of the MOSFET.

Package 140 can easily be mounted on, for example, a PCB using solder posts 128S and 128D. Solder post 128G is not shown in FIG. 13B but it too would be connected to the PCB so that the source, gate, and drain terminals of the MOSFET would be connected to the external circuitry. The drain terminal is on the back side of die 100A and is electrically connected via conductive plate 116. Package 140 contains no wire bonds and, as has been shown, can be manufactured in a batch process using the entire wafer.

Figure 14:
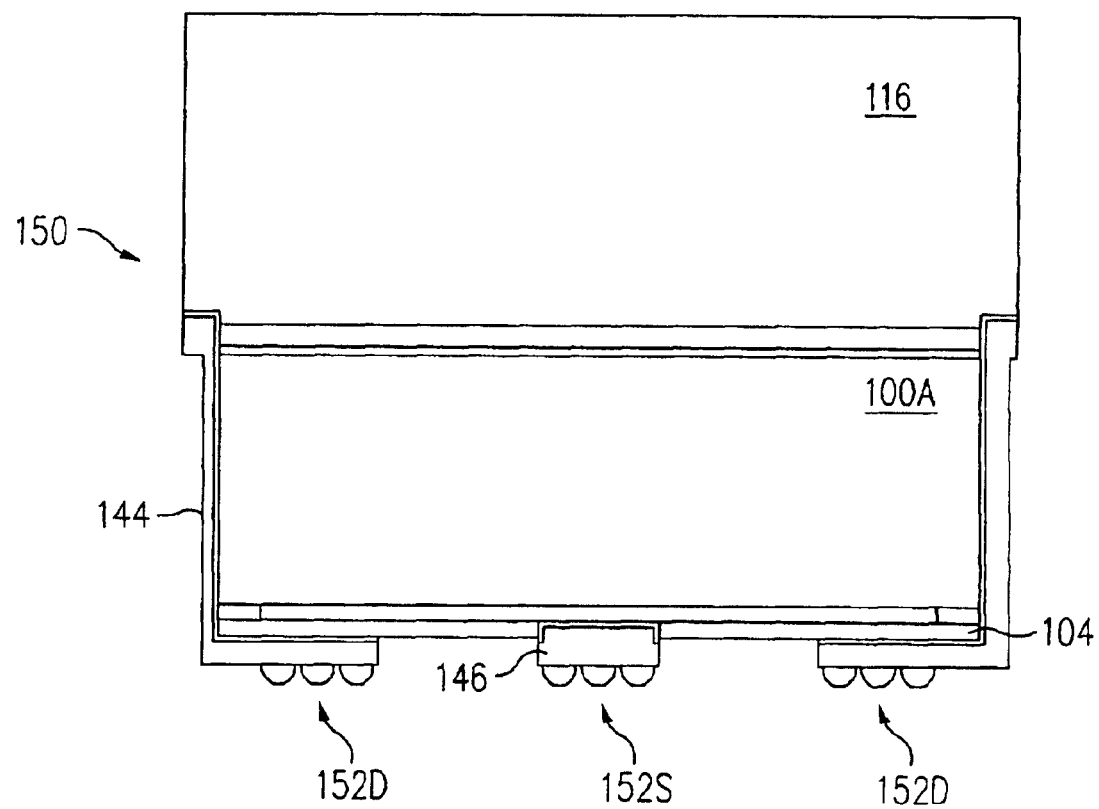
FIG. 14 illustrates a cross-sectional view of a semiconductor package in accordance with this invention wherein solder balls are used to make the electrical connections between the package and a printed circuit board.

FIG. 14 shows a cross-sectional view of a package 150 which is similar to package 140, except that solder balls 152S, 152D and 152G (not shown in FIG. 14) are used in place of solder posts 128S, 128D and 128G. The solder balls may be applied in a conventional manner by depositing and reflowing solder paste or by other processes such as screen-printing or solder jetting (using, for example, equipment available from Pac Tech GmbH, Am Schlangenhorst 15–17, 14641 Nauen, Germany) or by using the wafer level solder ball mounter available from Shibuya Kogyo Co., Ltd., Mameda-Honmachi, Kanazawa 920–8681, Japan. Conductive polymer bumps are another alternative, using for example thermosetting polymers, B-state adhesives, or thermoplastic polymers.

While a specific embodiment of this invention has been described, the described embodiment is intended to be illustrative and not limiting. For example, the die may have any number of connection pads on its front side. It will be apparent to those who are skilled in the art that numerous alternative embodiments are possible within the broad scope of this invention.

We claim:

1. A semiconductor structure comprising:
   a wafer comprising a first die and a second die;
   a conductive plate attached to a first surface of said wafer;
   a cut extending through said wafer and into a portion of said conductive plate, said cut between said first die and said second die;
   a passivation layer disposed above a second surface of said wafer; and
   a metal layer disposed in said cut and extending onto said passivation layer.

2. The semiconductor structure of claim 1 wherein said second surface of said wafer further comprising a connection pad for said first die, the metal layer is electrically insulated from said connection pad.

3. The semiconductor structure of claim 2 wherein said second surface of said wafer further comprising a connection pad for said second die, the metal layer is electrically insulated from said connection pad for said second die.

4. The semiconductor structure of claim 2 wherein said first die comprising a semiconductor device in electrical contact with said connection pad.

5. The semiconductor structure of claim 4 wherein said first surface of said wafer comprising a terminal in electrical contact with said conductive plate.

6. The semiconductor structure of claim 5 wherein said semiconductor device comprising a MOSFET.

7. The semiconductor structure of claim 5 wherein said metal layer in electrical contact with said terminal.

8. The semiconductor structure of claim 1 wherein said first die comprising a semiconductor device.

9. A semiconductor structure comprising:
   a wafer comprising a first die and a second die;
   a metal plate attached to a first surface of said wafer;
   a trench extending through said wafer and into a portion of said metal plate, said trench separating said first die and said second die;
   a passivation layer disposed above a second surface of said wafer, said first die comprises a first portion of said passivation layer and said second die comprises a second portion of said passivation layer; and
   a metal layer disposed in said trench and extending onto said first and second portions of said passivation layer.

10. The semiconductor structure of claim 9 wherein each of said first and second dice comprising a connection pad, the metal layer is electrically insulated from said connection pads.

11. The semiconductor structure of claim 10 wherein said first die comprising a semiconductor.

12. The semiconductor structure of claim 11 wherein the semiconductor device comprises a vertical power MOSFET.

13. The semiconductor structure of claim 11 wherein the semiconductor device comprises a bipolar transistor.

14. The semiconductor structure of claim 11 wherein the semiconductor device comprises a diode.

15. The semiconductor structure of claim 11 wherein the semiconductor device comprises a junction field effect transistor (JFET).

16. A semiconductor structure comprising:
   a wafer comprising a first device and a second device, a first surface of said wafer comprising a connection pad in electrical contact with said first device;
   a metal plate attached to a second surface of said wafer;
   a cut extending through said wafer and into a portion of said metal plate, said cut located between said first device and said second device;
   a passivation layer disposed above a portion of said first surface of said wafer; and
   a metal layer disposed overlying said cut and extending onto said passivation layer, said metal layer electrically insulated from said connection pad.

17. The semiconductor structure of claim 16 wherein said first surface of said wafer further comprising a connection pad in electrical contact with said second device, the metal layer electrically insulated from said connection pad in electrical contact with said second device.

18. The semiconductor structure of claim 16 wherein said second surface of said wafer comprises a terminal in electrical contact with said first device and said metal plate.

19. The semiconductor structure of claim 18 wherein said metal layer in electrical contact with said terminal.

20. The semiconductor structure of claim 16 wherein further comprising a second metal layer in electrical contact with said connection pad.

21. The semiconductor structure of claim 16 wherein the first device is one of a vertical power MOSFET and a diode.

22. The semiconductor structure of claim 16 wherein the first device is one of a bipolar transistor, a JFET, and an integrated circuit.

* * * * *